(12) United States Patent
Wei

(10) Patent No.: US 11,355,717 B2
(45) Date of Patent: Jun. 7, 2022

(54) FLEXIBLE SUBSTRATE AND MANUFACTURING METHOD THEREOF

(71) Applicant: Shenzhen China Star Optoelectronics Semiconductor Display Technology Co., Ltd., Shenzhen (CN)

(72) Inventor: Hongquan Wei, Shenzhen (CN)

(73) Assignee: Shenzhen China Star Optoelectronics Semiconduetor Display Technology Co., Ltd., Shenzhen (CN)

( * ) Notice: Subject to any disclaimer, the term of this patent is extended or adjusted under 35 U.S.C. 154(b) by 312 days.

(21) Appl. No.: 16/627,779

(22) PCT Filed: Dec. 19, 2019

(86) PCT No.: PCT/CN2019/126481
§ 371 (c)(1),
(2) Date: Dec. 31, 2019

(87) PCT Pub. No.: WO2021/109258
PCT Pub. Date: Jun. 10, 2021

(65) Prior Publication Data
US 2021/0359236 A1    Nov. 18, 2021

(30) Foreign Application Priority Data
Dec. 6, 2019 (CN) .......................... 201911242591.2

(51) Int. Cl.
*H01L 51/00* (2006.01)
*G02B 1/11* (2015.01)

(52) U.S. Cl.
CPC ............ *H01L 51/0097* (2013.01); *G02B 1/11* (2013.01)

(58) Field of Classification Search
None
See application file for complete search history.

(56) References Cited

U.S. PATENT DOCUMENTS

| 2004/0157065 A1 | 8/2004 | Miyatake et al. |
| 2007/0146887 A1 | 6/2007 | Ikeda et al. |
| (Continued) | | |

FOREIGN PATENT DOCUMENTS

| CN | 1412577 | 4/2003 |
| CN | 1922008 | 2/2007 |
| (Continued) | | |

OTHER PUBLICATIONS

Machine translation of KR 10-1816093 (Year: 2018).*

*Primary Examiner* — J. E. Schoenholtz

(57) ABSTRACT

A flexible substrate and a manufacturing method thereof are provided. The flexible substrate includes a substrate and an alignment layer. The alignment layer is disposed on the substrate and is in direct contact with the substrate. The alignment layer includes an alignment material and a plurality of core-shell particles. The core-shell particles are suspended in a surface layer of the alignment layer. The core-shell particles are decomposed when the alignment material is cured by heat to simultaneously generate a plurality of hollow structures that are approximately same size as the core-shell particles in the alignment layer, thereby forming an anti-reflection layer. The anti-reflection layer is configured to refract and block light from entering the substrate.

16 Claims, 2 Drawing Sheets

(56) References Cited

U.S. PATENT DOCUMENTS

| | | | |
|---|---|---|---|
| 2010/0079868 A1* | 4/2010 | Asakura | G02B 5/0278 359/586 |
| 2011/0164322 A1 | 7/2011 | Morozumi et al. | |
| 2013/0094088 A1 | 4/2013 | Merrill | |
| 2015/0179674 A1 | 6/2015 | Kim et al. | |
| 2018/0149905 A1 | 5/2018 | Min et al. | |
| 2019/0235133 A1 | 8/2019 | Van Dijck et al. | |
| 2020/0183224 A1* | 6/2020 | Lee | H01L 25/0753 |

FOREIGN PATENT DOCUMENTS

| | | |
|---|---|---|
| CN | 101470216 | 7/2009 |
| CN | 102086316 | 6/2011 |
| CN | 103038678 | 4/2013 |
| CN | 104732886 | 6/2015 |
| CN | 107140842 | 9/2017 |
| CN | 108117648 | 6/2018 |
| CN | 109852105 | 6/2019 |
| JP | 2005-186568 | 7/2005 |
| JP | 4632403 | 2/2011 |
| KR | 101816093 B1 * | 1/2018 |

* cited by examiner

FLEXIBLE SUBSTRATE AND MANUFACTURING METHOD THEREOF

RELATED APPLICATIONS

This application is a National Phase of PCT Patent Application No. PCT/CN2019/126481 having International filing date of Dec. 19, 2019, which claims the benefit of priority of Chinese Patent Application No. 201911242591.2 filed on Dec. 6, 2019. The contents of the above applications are all incorporated by reference as if fully set forth herein in their entirety.

FIELD AND BACKGROUND OF THE INVENTION

The present disclosure relates to a flexible substrate, and more particularly, to an anti-reflective flexible substrate.

Surfaces of display devices are generally required to have various functions, such as damage prevention and external light reflection prevention, to reduce light reflectance of the surfaces of the display devices, thereby obtaining excellent visual experiences. Flexible panels have higher requirements for anti-reflection functions. Visibility and contrast of bending portions are easily affected by external light reflection. Therefore, the surfaces of the display devices are usually coated with optical coatings to reduce surface reflection of the substrate. A function of this type of anti-reflective coatings is to reduce light reflection of the interface between two media having different refractive indices, such as light reflection between the substrate and air. According to Fresnel equation, the corresponding reflectance of a surface of a float glass that is in contact with air is 4.3%. It is desired to reduce the reflectance to less than 1% by the anti-reflection coating.

$$R = \left| \frac{1.00 - n_s}{1.00 + n_s} \right|^2$$

R is a reflectance and $n_s$ is a refractive index of the substrate (an interface between the substrate and air).

Common anti-reflection coating methods include multi-layer interference coatings, graded index coatings, and quarterwave coatings. In a main manufacturing method of the multi-layer interference coatings, layers having different refractive indices are deposited by multiple chemical vapor depositions (CVD) and etching processes. The processes are complicated and the costs are high. Moth-eye textured coating is one of the most common gradient index coatings. Compared with multi-layer interference coatings, although the moth-eye textured coating only requires one layer of coating, the moth-eye textured coating requires to form a refractive index gradient in the Z direction and to form periodic micro-nano structures on the surface. The periodic micro-nano structures are mainly manufactured by nanoimprint lithography. However, it is difficult to produce large-size films. Moth eye textured coatings have poor mechanical resistance and easily be scratched. Quarterwave coatings require a layer of coating and does not require complicated processes. Although the processes are simple, based upon current material limitations, the solid material having the lowest refractive index that is suitable for producing coatings is magnesium fluoride ($MgF_2$), which has a refractive index of 1.38. When a float glass is coated with a quarterwave coating, a reflectance of the float glass is 1.26%, which is still high. However, these methods still have the following problems in practical use, such as, low efficiency, complicated processes, and difficulty of increasing sizes.

Therefore, it is necessary to provide a flexible substrate to solve the existing problems in the prior art.

Technical Problems

In view of foregoing, the present disclosure provides an anti-reflective flexible substrate and a manufacturing method thereof in order to solve problems in the prior art, such as low efficiency, complicated processes, difficulty of increasing sizes, and high reflectivity.

SUMMARY OF THE INVENTION

An embodiment of the present disclosure provides a flexible substrate. The flexible substrate includes a substrate and an alignment layer.

The alignment layer is disposed on a surface of the substrate, wherein the alignment layer comprises an alignment material and a plurality of core-shell particles, a diameter of the core-shell particles is 0.1-10 micrometers, each of the core-shell particles comprises a hollow structure, the core-shell particles are suspended in a surface layer of the alignment layer, the core-shell particles are decomposed to simultaneously form an anti-reflection layer when the alignment material is cured by heat, the anti-reflection layer comprises a plurality of holes that are generated after the core-shell particles are decomposed, and the anti-reflection layer is configured to refract and block light from entering the substrate.

In an embodiment of the present disclosure, the core-shell particles are made of at least one of an organic polymer, a copolymer of an organic polymer, or an inorganic material.

In an embodiment of the present disclosure, the organic polymer is selected from the group consisting of cellulose, polyethylmethacrylate, poly(diisopropylamino) ethylmethacrylate, polystyrene, and combinations thereof.

In an embodiment of the present disclosure, the inorganic material is selected from the group consisting of Si, $SiN_x$, $MgF_2$, and combinations thereof.

In an embodiment of the present disclosure, a thickness of the substrate is 1-100 micrometers and a thickness of the anti-reflection layer is 0.1-50 micrometers.

In an embodiment of the present disclosure, the flexible substrate further comprises a protective layer disposed on a surface of the anti-reflection layer and the protective layer is configured to block water vapor and oxygen.

In an embodiment of the present disclosure, a refractive index of the core-shell particles is less than a refractive index of the protective layer, and a total reflectance of the core-shell particles and the substrate is less than 1% after the core-shell particles is laminated to the substrate.

An embodiment of the present disclosure further provides a manufacturing method of a flexible substrate, comprising steps of:

covering the substrate with an alignment material to form an alignment layer, wherein the alignment material is mixed with a plurality of core-shell particles, the core-shell particles are suspended in a surface layer of the alignment layer, and each of the core-shell particles comprises a hollow structure; and curing the alignment material by heat, wherein the core-shell particles of the alignment layer are thermally decomposed to simultaneously generate a plurality of holes in the surface layer of the alignment layer, thereby forming an anti-reflection layer.

In an embodiment of the present disclosure, the method further comprises a step of covering the anti-reflection layer with a protective layer.

Another embodiment of the present disclosure provides a flexible substrate.

The flexible substrate comprises a substrate and an alignment layer.

The alignment layer is disposed on a surface of the substrate, wherein the alignment layer comprises an alignment material and a plurality of core-shell particles, each of the core-shell particles comprises a hollow structure, the core-shell particles are suspended in a surface layer of the alignment layer, the core-shell particles are decomposed to simultaneously form an anti-reflection layer when the alignment material is cured by heat, the anti-reflection layer comprises a plurality of holes that are generated after the core-shell particles are decomposed, and the anti-reflection layer is configured to refract and block light from entering the substrate.

In an embodiment of the present disclosure, the core-shell particles are made of at least one of an organic polymer, a copolymer of an organic polymer, or an inorganic material.

In an embodiment of the present disclosure, the organic polymer is selected from the group consisting of cellulose, polyethylmethacrylate, poly(diisopropylamino) ethylmethacrylate, polystyrene, and combinations thereof.

In an embodiment of the present disclosure, the inorganic material is selected from the group consisting of Si, $SiN_x$, $MgF_2$, and combinations thereof.

In an embodiment of the present disclosure, a thickness of the substrate is 1-100 micrometers and a thickness of the anti-reflection layer is 0.1-50 micrometers.

In an embodiment of the present disclosure, the flexible substrate further comprises a protective layer disposed on a surface of the anti-reflection layer and the protective layer is configured to block water vapor and oxygen.

In an embodiment of the present disclosure, a refractive index of the core-shell particles is less than a refractive index of the protective layer, and a total reflectance of the core-shell particles and the substrate is less than 1% after the core-shell particles is laminated to the substrate.

Beneficial Effects

Compared with the prior art, the flexible substrate of the present disclosure not only omits complicated processes of depositing anti-reflection coatings to save manpower and production costs, but also overcomes a bottleneck in the prior art by reducing the reflectance to less than 1%. It also enables flexible substrates to be produced in a high-efficiency and continuous production process, such as a roll-to-roll process. Mass production of flexible substrates is thus achieved. In addition, the alignment layer of the present disclosure has functions of both alignment and anti-reflection. A desired reflectivity can also be obtained by controlling the number of the core-shell particles.

For a better understanding of the aforementioned content of the present invention, preferable embodiments are illustrated in accordance with the attached figures for detailed explanation.

DESCRIPTION OF SPECIFIC EMBODIMENTS OF THE INVENTION

In the following detailed description, reference is made to the accompanying figures, in which various examples are shown by way of illustration. In this regard, directional terminology mentioned in the present disclosure, such as "top", "bottom", "front", "back", "left", "right", "inner", "outer", "lateral", "side", "surrounding", "center", "horizontal", "transverse", "vertical", "longitudinal", "axial", "radial", "uppermost" or "lowermost", etc., is used with reference to the orientation of the figures being described. Therefore, the directional terminology is used for purposes of illustration and is not intended to limit the present invention. In the accompanying figures, units with similar structures are indicated by the same reference numbers.

As used herein, the singular form "a", "an" and "the" include plural references unless the context clearly dictates otherwise. For example, the term "a compound" or "at least one compound" may include a plurality of compounds, including mixtures thereof.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination or as suitable in any other described embodiment of the invention. Certain features described in the context of various embodiments are not to be considered essential features of those embodiments, unless the embodiment is inoperative without those elements.

As used herein with reference to size or value are not intended to be construed as an inflexible limitation to the precise values. On the contrary, unless otherwise indicated, the various sizes are intended to represent the recited numerical values as well as the functionally equivalent ranges thereof. For example, a disclosed size of "10 micrometers" refers to "about 0.010 micrometers".

Figure 1:
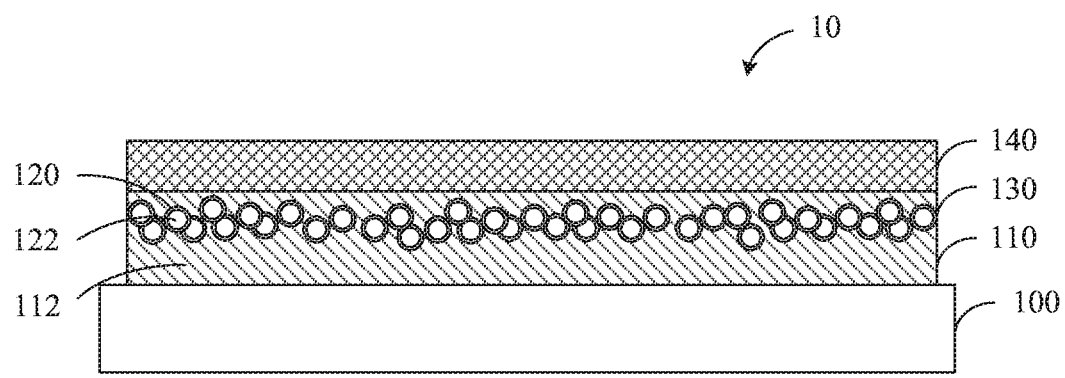
FIG. 1 is a schematic diagram of a flexible substrate according to an embodiment of the present disclosure.

Referring to FIG. 1, a flexible substrate 10 of an embodiment of the present disclosure mainly includes a substrate 100, an alignment layer 110, and a protective layer 140. The substrate 100 may be float glass. In an embodiment of the present disclosure, a thickness of the substrate 100 is 1-100 micrometers. The alignment layer 110 is disposed on a surface of the substrate 100. The alignment layer 110 includes an alignment material 112 and a plurality of core-shell particles 120. The alignment material 112 may be an organic polymer. The alignment material 112 may be selected from the group consisting of polyamide, polyimide, polycarbonate, polymethyl methacrylate (PMMA), and combinations thereof. The protective layer 140 is disposed on a surface of the anti-reflection layer 140 to isolate water vapor and oxygen. The protective layer 140 may be an inorganic material. The protective layer 140 may be selected from the group consisting of silicon nitride, aluminum oxide, titanium oxide, and zirconium oxide, and combinations thereof. A refractive index of silicon nitride is 1.77. A refractive index of titanium oxide is 2.65. A refractive index of zirconium oxide is 2.17.

Each of core-shell particles 120 has a hollow structure 122. The core-shell particles 120 are suspended adjacent a surface layer of the alignment layer 110. A plurality of core-shell particles 120 decompose and simultaneously form an anti-reflection layer 130 when the alignment material 112 is cured by heat. The anti-reflection layer 130 has a plurality of holes that are generated after the core-shells particles 120 are decomposed. The anti-reflection layer 130 is used for refracting and blocking light from entering the substrate 100. The anti-reflection layer 130 and the alignment layer 110 are integrally formed, which omits multiple processes and manufacturing costs. The problem that traditional anti-reflection coatings loss their function due to being easily scratched on the display panel is also solved. In addition, because the core-shell particles 120 are decomposed under a high temperature, no color shift phenomenon will occur because of adding additional particles.

In one embodiment of the present disclosure, a thickness of the anti-reflection layer 130 is 0.1-50 micrometers. In an embodiment of the present disclosure, a diameter of the core-shell particles 120 is 0.1-10 micrometers. In an embodiment of the present disclosure, a size of the holes of the anti-reflection layer 130 is 0.1-10 micrometers. The core-shell particles 120 having the hollow structures 122 decompose upon heating and leave a plurality of holes in the surface layer of the alignment layer 110 to form the anti-reflection layer 130, such that the anti-reflection layer 130 becomes a porous structure. Using the air within the holes, the light is refracted to different angles when passing through the anti-reflection layer 130. The anti-reflection layer 130 further blocks light from entering the substrate 100, and increases a refractive index of the alignment layer 110, thereby reducing a reflectance of the flexible substrate 10. The reflectance is reduced to less than 1%.

The core-shell particles 120 may be made of an easily decomposable material. The core-shell particles 120 may be made of at least one of an organic polymer, a copolymer of an organic polymer, or an inorganic material. The organic polymer is selected from the group consisting of cellulose, polyethylmethacrylate, poly(diisopropylamino) ethylmethacrylate, polystyrene, and combinations thereof. The inorganic material is selected from the group consisting of Si, $SiN_x$, $MgF_2$, and combinations thereof. In an embodiment of the present disclosure, a refractive index of a material used for manufacturing the core-shell particles 120 is similar to a refractive index of the protective layer 140.

Figure 2:
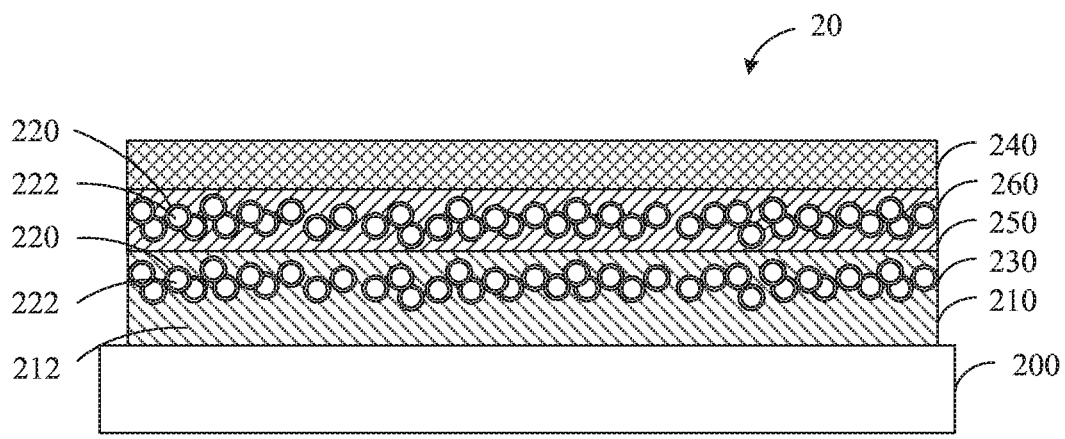
FIG. 2 is a schematic diagram of a flexible substrate according to another embodiment of the present disclosure.

Please refer to FIG. 2. FIG. 2 is a schematic diagram of a flexible substrate according to another embodiment of the present disclosure. The flexible substrate 20 includes a substrate 200, a first alignment layer 210, a second alignment layer 230, and a protective layer 240. The substrate 200 may be a float glass. The alignment layer 210 includes an alignment material 212 and a plurality of core-shell particles 220. The alignment material 212 may be an organic polymer. The alignment material 212 may be selected from the group consisting of polyamide, polyimide, polyimide, polycarbonates, polymethyl methacrylate (PMMA), and combinations thereof. In one embodiment of the present disclosure, the flexible substrate 20 may have two or more alignment layers. The first alignment layer 210 is disposed on a surface of the substrate 200. The second alignment layer 250 is disposed on a surface of the first alignment layer 210 and so on. In the first alignment layer 210, each of the core-shell particles 220 has a hollow structure 222. The core-shell particles 220 are suspended on the surface layer of the first alignment layer 210. The core-shell particles 220 of the first alignment layer 210 are decomposed to simultaneously form a first anti-reflection layer 230 when the alignment material 212 is cured by a first heating process. The first anti-reflection layer 230 has a plurality of holes that are generated after the core-shell particles 220 are decomposed. Then a second alignment layer 250 is coated on a surface of the cured first alignment layer 210. A thickness of the second alignment layer 250 may be less than that a thickness of the first alignment layer 210, so that each of the core-shell particles is evenly distributed on the second alignment layer 250. A plurality of core-shell particles 220 of the second alignment layer 230 decompose and simultaneously form a second anti-reflection layer 260 when the alignment material 212 is cured by a second heating process. The core-shell particles 220 can be evaporated or sublimated into the air after being thermally decomposed. The core-shell particles 220 can also be absorbed by the alignment material 212 during the curing process by heat.

Each of the core-shell particles 220 has a hollow structure 222 and the core-shell particles 220 are suspended adjacent the surface layer of the first alignment layer 210. In an embodiment of the present disclosure, a thickness of each of the anti-reflection layers 230 is 0.1-50 micrometers. In an embodiment of the present disclosure, a diameter of the core-shell particles 220 is 0.1-10 micrometers. In an embodiment of the present disclosure, a size of the holes of each of the anti-reflection layers 230 is 0.1-10 micrometers. The first anti-reflection layer 230 and the second anti-reflection layer 260 further refract and block light from entering the substrate 200, so that the refractive index increases layer by layer. The final reflectance of the flexible panel 20 is less than 1%.

The protective layer 240 is disposed on a surface of the anti-reflection layer 240 to isolate water vapor and oxygen. The protective layer 240 may be an inorganic material. The protective layer 240 may be selected from the group consisting of silicon nitride, aluminum oxide, titanium oxide, zirconium oxide, and combinations thereof.

The core-shell particles 220 may be made of a decomposable material. The core-shell particles 220 may be made of at least one of an organic polymer, a copolymer of an organic polymer, or an inorganic material. The organic polymer is selected from the group consisting of cellulose, polyethyl methacrylate, poly(diisopropylamino) ethyl methacrylate, polystyrene, and combinations thereof. The inorganic material is selected from the group consisting of Si, $SiN_x$, $MgF_2$, and combinations thereof. In an embodiment of the present disclosure, a refractive index of a material for manufacturing the core-shell particles 220 is similar to a refractive index of the protective layer 240. The core-shell particles 220 can be prepared by an emulsion polymerization, a two-stage core/shell emulsion polymerization, a semi-continuous pre-emulsification process, a spray process, or an inverse suspension polymerization.

Figure 3:
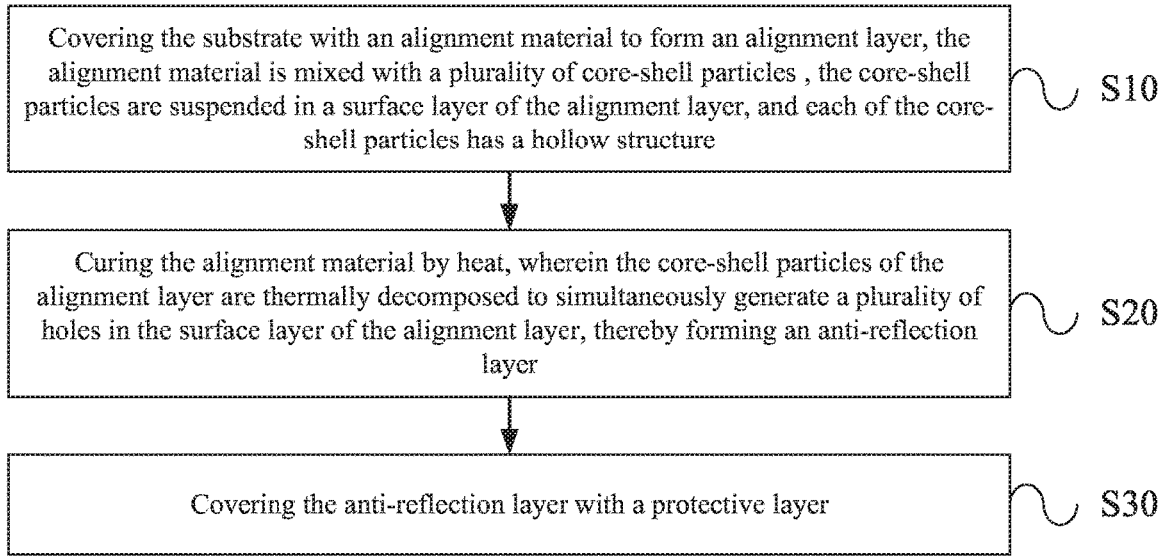
FIG. 3 is a flowchart of a manufacturing method of a flexible substrate according to another embodiment of the present disclosure.

Please refer to FIG. 1 and FIG. 3. FIG. 3 is a flowchart of a manufacturing method of a flexible substrate according to another embodiment of the present disclosure.

A manufacturing method thereof a flexible substrate according to an embodiment of the present disclosure includes steps of:

A step S10 of covering the substrate with an alignment material 112 to form an alignment layer 110, wherein the alignment material is mixed with a plurality of core-shell particles 120, the core-shell particles 120 are suspended in a surface layer of the alignment layer 110, and each of the core-shell particles 120 has a hollow structure 122.

A step S20 of curing the alignment material 112 by heat, wherein the core-shell particles 120 of the alignment layer 110 are thermally decomposed to simultaneously generate a plurality of holes in the surface layer of the alignment layer, thereby forming an anti-reflection layer 130.

A step S30 of covering the anti-reflection layer 140 with a protective layer 130.

Figure 4:
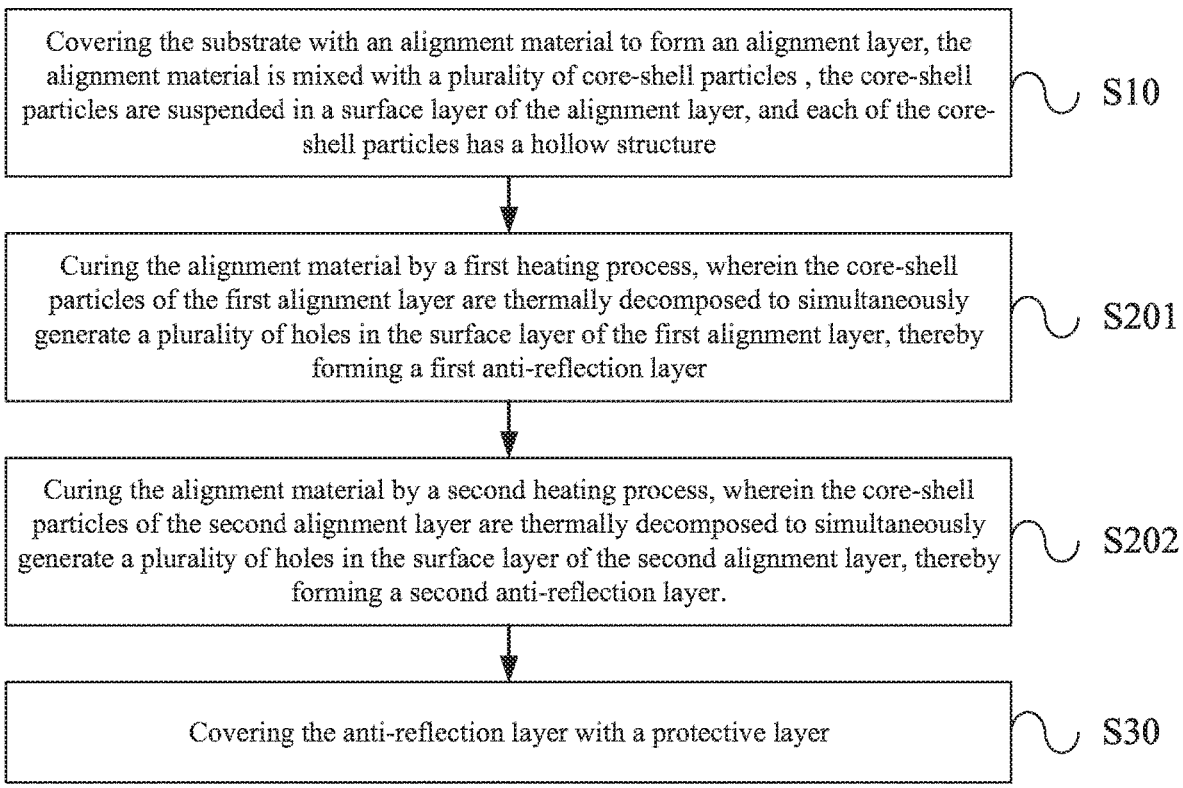
FIG. 4 is a flowchart of a manufacturing method of a flexible substrate according to another embodiment of the present disclosure.

Please refer to FIG. 2 and FIG. 4. FIG. 4 is a flowchart of a manufacturing method of a flexible substrate according to another embodiment of the present disclosure. The step S20 of the manufacturing method of a flexible substrate according to an embodiment of the present disclosure may include, A step S201 of curing the alignment material 212 by a first heating process. The core-shell particles 220 of the first alignment layer 210 are thermally decomposed to simultaneously generate a plurality of holes in the surface layer of the first alignment layer 210, thereby forming a first anti-reflection layer 230.

A step S202 of curing the alignment material 212 by a second heating process. The core-shell particles 220 of the second alignment layer 250 are thermally decomposed to simultaneously generate a plurality of holes in the surface layer of the second alignment layer 250, thereby forming a second anti-reflection layer 260.

As described above, the problems that the existing flexible substrates have high reflectivity, and reduce the visibility and contrast of the panel, the manufacturing process is complicated, the efficiency is low, and it is difficult to produce large-sized films are overcome. The flexible panel of the present disclosure is integrally formed of an alignment layer and an anti-reflection layer, and a coating process is used on the substrate, allowing mass production of the flexible panel. In addition, the flexible panel of the present disclosure can not only control the number and size of core-shell particles to control the alignment layer and adjust the number and size of the holes to obtain the desired reflectance, so that the final reflectance of the flexible panel is less than 1%, but also overcomes the problems that the traditional anti-reflection coating film has poor mechanical resistance and is easy to be scratched, which can effectively increase the service lifespan of the flexible panel and further improve the stability.

The present disclosure has been described with the above related embodiments. However, the above embodiments are merely examples for implementing the present disclosure. It is noted that the disclosed embodiments are not intended to limit the scope of the present disclosure. On the contrary, modifications and equivalent arrangements that are included in the spirit and scope of the appended claims fall within the scope of the present disclosure.

The invention claimed is:

1. A flexible substrate, comprising:
a substrate;
a first alignment layer disposed on a surface of the substrate, wherein the first alignment layer comprises an alignment material and a plurality of core-shell particles, a diameter of the core-shell particles is 0.1-10 micrometers, each of the core-shell particles comprises a hollow structure, wherein in the first alignment layer, the core-shell particles are only suspended in a surface layer of the first alignment layer, the core-shell particles are decomposed to simultaneously form a first anti-reflection layer when the alignment material is cured by heat, the first anti-reflection layer comprises a plurality of holes that are generated after the core-shell particles are decomposed, and the first anti-reflection layer is configured to refract and block light from entering the substrate; and
a second alignment layer disposed on a surface of the first alignment layer, wherein a thickness of the second alignment layer is less than that a thickness of the first alignment layer, wherein the second alignment layer comprises the alignment material and the plurality of core-shell particles, the core-shell particles are decomposed to simultaneously form a second anti-reflection layer when the alignment material is cured by heat, the second anti-reflection layer comprises a plurality of holes that are generated after the core-shell particles are decomposed, and the second anti-reflection layer is configured to refract and block light from entering the substrate.

2. The flexible substrate according to claim 1, wherein the core-shell particles are made of at least one of an organic polymer, a copolymer of an organic polymer, or an inorganic material.

3. The flexible substrate according to claim 2, wherein the organic polymer is selected from the group consisting of cellulose, polyethylmethacrylate, poly (diisopropylamino) ethylmethacrylate, polystyrene, and combinations thereof.

4. The flexible substrate according to claim 2, wherein the inorganic material is selected from the group consisting of Si, $SiN_x$, $MgF_2$, and combinations thereof.

5. The flexible substrate according to claim 1, wherein a thickness of the substrate is 1-100 micrometers and a thickness of each of the first anti-reflection layer and the second anti-reflection layer is 0.1-50 micrometers.

6. The flexible substrate according to claim 1, wherein the flexible substrate further comprises a protective layer disposed on a surface of the second anti-reflection layer and the protective layer is configured to block water vapor and oxygen.

7. The flexible substrate according to claim 6, wherein a refractive index of the core-shell particles is less than a refractive index of the protective layer, and a total reflectance of the core-shell particles and the substrate is less than 1% after the core-shell particles is laminated to the substrate.

8. A manufacturing method of a flexible substrate, comprising steps of:
covering the substrate with an alignment material to form a first alignment layer, wherein the alignment material is mixed with a plurality of core-shell particles, wherein in the first alignment layer, the core-shell particles are only suspended in a surface layer of the first alignment layer, and each of the core-shell particles comprises a hollow structure;
covering the first alignment layer with the alignment material to form a second alignment layer, wherein in the second alignment layer, the alignment material is mixed with the plurality of core-shell particles and each of the core-shell particles comprises the hollow structure; and curing the alignment material by heat, wherein the core-shell particles of the alignment layer are thermally decomposed to simultaneously generate a plurality of holes only in the surface layer of the first alignment layer and in the second alignment layer, thereby forming a first anti-reflection layer from the first alignment layer and forming a second anti-reflection layer from the second alignment layer.

9. The manufacturing method according to claim 8, wherein the method further comprises a step of covering the second anti-reflection layer with a protective layer.

10. A flexible substrate, comprising:
a substrate;
a first alignment layer disposed on a surface of the substrate, wherein the first alignment layer comprises an alignment material and a plurality of core-shell particles, each of the core-shell particles comprises a hollow structure, wherein in the first alignment layer, the core-shell particles are only suspended in a surface layer of the first alignment layer, the core-shell particles are decomposed to simultaneously form a first anti-reflection layer when the alignment material is cured by heat, the first anti-reflection layer comprises a plurality of holes that are generated after the core-shell particles are decomposed, and the first anti-reflection layer is configured to refract and block light from entering the substrate; and
a second alignment layer disposed on a surface of the first alignment layer, wherein a thickness of the second alignment layer is less than that a thickness of the first alignment layer, wherein the second alignment layer comprises the alignment material and the plurality of core-shell particles, the core-shell particles are decomposed to simultaneously form a second anti-reflection layer when the alignment material is cured by heat, the second anti-reflection layer comprises a plurality of holes that are generated after the core-shell particles are decomposed, and the second anti-reflection layer is configured to refract and block light from entering the substrate.

11. The flexible substrate according to claim 10, wherein the core-shell particles are made of at least one of an organic polymer, a copolymer of an organic polymer, or an inorganic material.

12. The flexible substrate according to claim 11, wherein the organic polymer is selected from the group consisting of cellulose, polyethylmethacrylate, poly (diisopropylamino) ethylmethacrylate, polystyrene, and combinations thereof.

13. The flexible substrate according to claim 11, wherein the inorganic material is selected from the group consisting of Si, $SiN_x$, $MgF_2$, and combinations thereof.

14. The flexible substrate according to claim 10, wherein a thickness of the substrate is 1-100 micrometers and a thickness of each of the first anti-reflection layer and the second anti-reflection layer is 0.1-50 micrometers.

15. The flexible substrate according to claim 10, wherein the flexible substrate further comprises a protective layer disposed on a surface of the second anti-reflection layer and the protective layer is configured to block water vapor and oxygen.

16. The flexible substrate according to claim 15, wherein a refractive index of the core-shell particles is less than a refractive index of the protective layer, and a total reflectance of the core-shell particles and the substrate is less than 1% after the core-shell particles is laminated to the substrate.

* * * * *

UNITED STATES PATENT AND TRADEMARK OFFICE
CERTIFICATE OF CORRECTION

PATENT NO. : 11,355,717 B2
APPLICATION NO. : 16/627779
DATED : June 7, 2022
INVENTOR(S) : Hongquan Wei Page 1 of 1

It is certified that error appears in the above-identified patent and that said Letters Patent is hereby corrected as shown below:

On the Title Page

Item (73) Assignee:
"Shenzhen China Star Optoelectronies Semiconduetor Display Technology Co. Ltd."
Should be changed to:
--Shenzhen China Star Optoelectronics Semiconductor Display Technology Co., Ltd.--

Signed and Sealed this
Tenth Day of January, 2023

Katherine Kelly Vidal
*Director of the United States Patent and Trademark Office*